(12) United States Patent
Yamazaki et al.

(10) Patent No.: US 9,331,207 B2
(45) Date of Patent: May 3, 2016

(54) OXIDE SEMICONDUCTOR DEVICE AND MANUFACTURING METHOD THEROF

(71) Applicants: Shunpei Yamazaki, Setagaya (JP); Naoya Sakamoto, Tochigi (JP); Takahiro Sato, Tochigi (JP); Shunsuke Koshioka, Tochigi (JP); Takayuki Cho, Tochigi (JP); Yoshitaka Yamamoto, Yamatokoriyama (JP); Takuya Matsuo, Osaka (JP); Hiroshi Matsukizono, Osaka (JP); Yosuke Kanzaki, Osaka (JP)

(72) Inventors: Shunpei Yamazaki, Setagaya (JP); Naoya Sakamoto, Tochigi (JP); Takahiro Sato, Tochigi (JP); Shunsuke Koshioka, Tochigi (JP); Takayuki Cho, Tochigi (JP); Yoshitaka Yamamoto, Yamatokoriyama (JP); Takuya Matsuo, Osaka (JP); Hiroshi Matsukizono, Osaka (JP); Yosuke Kanzaki, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 13/937,591

(22) Filed: Jul. 9, 2013

(65) Prior Publication Data
US 2014/0021466 A1 Jan. 23, 2014

(30) Foreign Application Priority Data
Jul. 17, 2012 (JP) .................. 2012-158495

(51) Int. Cl.
*H01L 29/10* (2006.01)
*H01L 29/786* (2006.01)
*H01L 29/201* (2006.01)

(52) U.S. Cl.
CPC .......... *H01L 29/7869* (2013.01); *H01L 29/201* (2013.01)

(58) Field of Classification Search
CPC ............................ H01L 29/7869; H01L 21/16
USPC ............................................. 257/43; 438/104
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

"Recede" Dictionary.com, Unabridged. Random House, Inc. http://dictionary.reference.com/browse/recede (accessed: Aug. 31, 2015).*
(Continued)

*Primary Examiner* — Jami M Valentine
(74) *Attorney, Agent, or Firm* — Eric J. Robinson; Robinson Intellectual Property Law Office, P.C.

(57) ABSTRACT

A semiconductor device includes a gate electrode; a gate insulating film over the gate electrode; an oxide semiconductor film in contact with the gate insulating film and including a channel formation region which overlaps with the gate electrode; a source electrode and a drain electrode over the oxide semiconductor film; and an oxide insulating film over the oxide semiconductor film, the source electrode, and the drain electrode. The source electrode and the drain electrode each include a first metal film having an end portion at the end of the channel formation region, a second metal film over the first metal film and containing copper, and a third metal film over the second metal film. The second metal film is formed on the inner side than the end portion of the first metal film.

9 Claims, 6 Drawing Sheets

(56) References Cited

U.S. PATENT DOCUMENTS

| Patent/Pub. No. | Date | Assignee |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,410,002 B2 | 4/2013 | Yamazaki et al. |
| 8,421,068 B2 | 4/2013 | Yamazaki et al. |
| 8,501,564 B2 | 8/2013 | Suzawa et al. |
| 8,742,544 B2 | 6/2014 | Yamazaki et al. |
| 8,823,074 B2 | 9/2014 | Suzawa et al. |
| 9,064,967 B2 | 6/2015 | Suzawa et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0084780 A1* | 5/2004 | Yew et al. ............. 257/774 |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025675 A1* | 2/2010 | Yamazaki et al. ............. 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0084267 A1 | 4/2011 | Yamazaki et al. |
| 2011/0108837 A1 | 5/2011 | Yamazaki et al. |
| 2011/0127521 A1 | 6/2011 | Yamazaki |
| 2011/0136301 A1 | 6/2011 | Yamazaki et al. |
| 2012/0261657 A1 | 10/2012 | Takahashi et al. |
| 2014/0264327 A1 | 9/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar

(56) References Cited

OTHER PUBLICATIONS

Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IgZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and SC2O3—A2O3—BO Systems [A; Fe, Ga or Al; B: Mg, Mn, Fe, Ni, Cu,or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) ,2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hyprid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

OXIDE SEMICONDUCTOR DEVICE AND MANUFACTURING METHOD THEROF

BACKGROUND OF THE INVENTION

1. Field of the Invention

The present invention relates to a semiconductor device using an oxide semiconductor and a manufacturing method thereof. Note that in this specification, a semiconductor device refers to a semiconductor element itself or a device including a semiconductor element. As an example of such a semiconductor element, for example, a transistor (a thin film transistor and the like) can be given. In addition, a semiconductor device also refers to a display device such as a liquid crystal display device.

2. Description of the Related Art

There is a trend in a display device using a transistor (e.g., a liquid crystal panel and an organic EL panel) toward a larger screen. As the screen size becomes larger, in the case of a display device using an active element such as a transistor, a voltage applied to an element varies depending on the position of a wiring which is connected to the element due to wiring resistance, which cause a problem of deterioration of display quality such as display unevenness and a defect in grayscale.

Conventionally, an aluminum film has been widely used as a material used for the wiring, the signal line, or the like; moreover, research and development of using a copper film as a material is extensively conducted to further reduce resistance. However, a copper film is disadvantageous in that adhesion thereof to a base film is low and that characteristics of a transistor easily deteriorate due to diffusion of copper element in the copper film into a semiconductor layer of the transistor. Note that a silicon-based semiconductor material is widely known as a material for a semiconductor thin film applicable to a transistor, and as another material, an oxide semiconductor has attracted attention (e.g., Patent Documents 1 and 2).

In a transistor using a silicon-based semiconductor material, research and development on a structure in which a copper film is used for a wiring, a signal line, or the like and copper element of the copper film are not diffused to a semiconductor layer have been extensively conducted. However, there has been a problem in that the structure and a method for manufacturing it are not suitable yet for a transistor using an oxide semiconductor film.

Further, in the transistor using an oxide semiconductor film in which a copper film is used for a wiring, a signal line, or the like and a barrier film is used to suppress diffusion of copper element of the copper film, when the structure in which copper element of the copper film are not diffused to the oxide semiconductor film is employed in order not to affect electric characteristics of the oxide semiconductor film, there has been a problem in that the number of masks and the manufacturing cost were increased.

REFERENCE

Patent Document

[Patent Document 1] Japanese Published Patent Application No. 2007-123861
[Patent Document 2] Japanese Published Patent Application No. 2007-096055

SUMMARY OF THE INVENTION

One embodiment of the present invention is to provide a semiconductor device with stable electric characteristics and high reliability in which a transistor using an oxide semiconductor film includes a wiring, a signal line, or the like formed using a copper-containing metal film. Another embodiment of the present invention is to provide a method for manufacturing the semiconductor device.

One embodiment of the present invention will be described below. In a bottom-gate transistor using an oxide semiconductor film, a source electrode and a drain electrode are formed in contact with the oxide semiconductor film. The source electrode and the drain electrode include a first metal film, a second metal film formed over the first metal film, and a third metal film formed over the second metal film. A copper-containing film is used as the second metal film. In addition, the end portion of the second metal film is preferably formed on the inner side than the end portions of the first metal film and the third metal film. Since the second metal film is formed on the inner side than the first metal film and the third metal film, the second metal film can be formed away from a channel formation region; thus, copper element which might be diffused into the channel formation region can be reduced.

Various embodiments of the present invention will be described below. One embodiment of the present invention is a semiconductor device including a gate electrode; a gate insulating film over the gate electrode; an oxide semiconductor film in contact with the gate insulating film and including a channel formation region which overlaps with the gate electrode; a source electrode and a drain electrode over the oxide semiconductor film; and an oxide insulating film over the oxide semiconductor film, the source electrode, and the drain electrode. The source electrode and the drain electrode each include a first metal film having an end portion at the end of the channel formation region, a second metal film over the first metal film and containing copper, and a third metal film over the second metal film. The end portion of the second metal film is formed on the inner side than the end portion of the first metal film.

In one embodiment of the present invention, the thickness of the oxide semiconductor film in the channel formation region is preferably smaller than that of the oxide semiconductor film in contact with the first metal film.

In one embodiment of the present invention, the end portion of the second metal film is preferably formed on the inner side than the end portion of the third metal film on the channel formation region side.

In one embodiment of the present invention, the end portion of the second metal film on the channel formation region side is preferably formed in a position not overlapping with the oxide semiconductor film.

Further, one embodiment of the present invention preferably includes a protective film covering the end portion of the second metal film on the channel formation region side. Further, in one embodiment of the present invention, it is preferable that at least one of the first metal film and the third metal film include a metal or a metal nitride containing one or more elements selected from the group consisting of tungsten, tantalum, titanium, and molybdenum.

Further, in one embodiment of the present invention, it is preferable that the oxide semiconductor film contain at least one oxide selected from the group consisting of indium oxide, zinc oxide, gallium oxide, and tin oxide.

Moreover, in one embodiment of the present invention, it is preferable that the oxide semiconductor film be an In—Ga—Zn-based oxide semiconductor film.

Further, in one embodiment of the present invention, it is preferable that the oxide semiconductor film include a crystal part where a c-axis is aligned in a direction parallel to a normal vector of a surface where the oxide semiconductor film is formed.

One embodiment of the present invention is a method for manufacturing a semiconductor device, including the following steps: forming a gate insulating film over a gate electrode; forming an oxide semiconductor film in contact with the gate insulating film, which includes a channel formation region overlapping with the gate electrode; forming a first metal film over the oxide semiconductor film; forming a second metal film containing copper, over the first metal film; forming a third metal film over the second metal film; forming a mask over the third metal film; removing part of each of the third metal film and the second metal film by a first etching using the mask; removing part of the first metal film by a second etching using the mask, thereby forming a source electrode and a drain electrode including the first metal film, the second metal film, and the third metal film; removing the mask; and forming an oxide insulating film over the oxide semiconductor film, the source electrode, and the drain electrode. The first metal film has an end portion at the end of the channel formation region. The second metal film is formed on the inner side than the end portion of the first metal film by reducing the second metal film to a position inner than the mask in the first etching, so that the second metal film is formed on the inner side than the end portion of the first metal film.

In one embodiment of the present invention, the thickness of the oxide semiconductor film in the channel formation region is preferably smaller than that of the oxide semiconductor film in contact with the first metal film, by removing part of the oxide semiconductor film in the second etching.

In one embodiment of the present invention, the end portion of the second metal film is preferably formed on the inner side than the end portion of the third metal film on the channel formation region side.

Further, in one embodiment of the present invention, in the first etching, the end portion of the second metal film on the channel formation region side is preferably reduced to a position not overlapping with the oxide semiconductor film.

Further, in one embodiment of the present invention, the protective film covering the end portion of the second metal film on the channel formation region side is preferably left as follows: after the step of removing the mask and before the step of forming the oxide insulating film, a protective film is formed over the oxide semiconductor film, the source electrode, and the drain electrode, and part of the protective film is selectively removed. Further, in one embodiment of the present invention, it is preferable that at least one of the first metal film and the third metal film include a metal or a metal nitride containing one or more elements selected from the group consisting of tungsten, tantalum, titanium, and molybdenum.

Further, in one embodiment of the present invention, it is preferable that the oxide semiconductor film contain at least one oxide selected from the group consisting of indium oxide, zinc oxide, gallium oxide, and tin oxide.

Moreover in one embodiment of the present invention, it is preferable that the oxide semiconductor film be an In—Ga—Zn-based oxide semiconductor film.

Further, in one embodiment of the present invention, it is preferable that the oxide semiconductor film include a crystal part where a c-axis is aligned in a direction parallel to a normal vector of a surface where the oxide semiconductor film is formed.

One embodiment of the present invention is to provide a semiconductor device with stable electric characteristics and high reliability in which a transistor using an oxide semiconductor film includes a wiring, a signal line, or the like formed using a copper-containing metal film. Another embodiment of the present invention is to provide a method for manufacturing the semiconductor device. One embodiment of the present invention can provide a method for manufacturing the semiconductor device.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the invention should not be construed as being limited to the description in the following embodiments.

In this embodiment, one embodiment of a semiconductor device and a method for manufacturing the semiconductor device will be described with reference to FIGS. 1A to 1C, FIGS. 2A to 2E, FIGS. 3A to 3D, FIGS. 4A to 4C, FIGS. 5A to 5D, and FIGS. 6A to 6C.

[Structural Example 1 of Semiconductor Device]

Figure 1A:
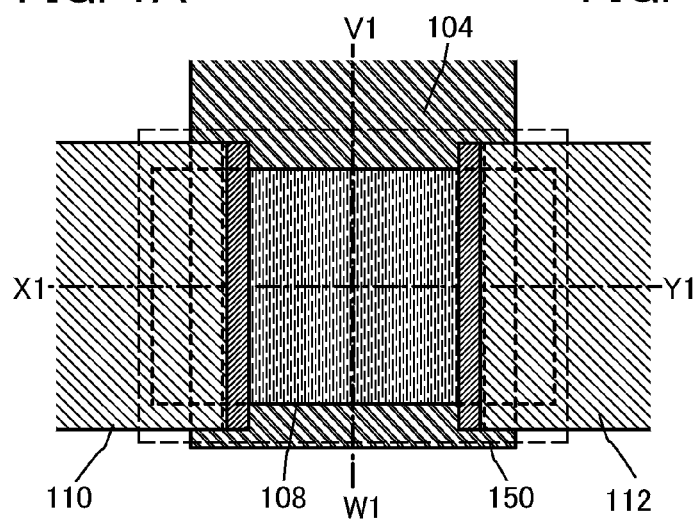
FIGS. 1A to 1C are a plan view illustrating a structural example 1 of a semiconductor device, a cross-sectional view taken along line X1-Y1 in FIG. 1A, and a cross-sectional view taken along line V1-W1 in FIG. 1A, respectively.
Figure 1C:
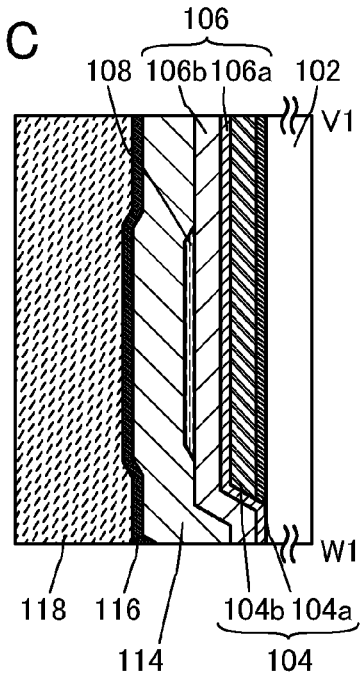
Figure 1B:
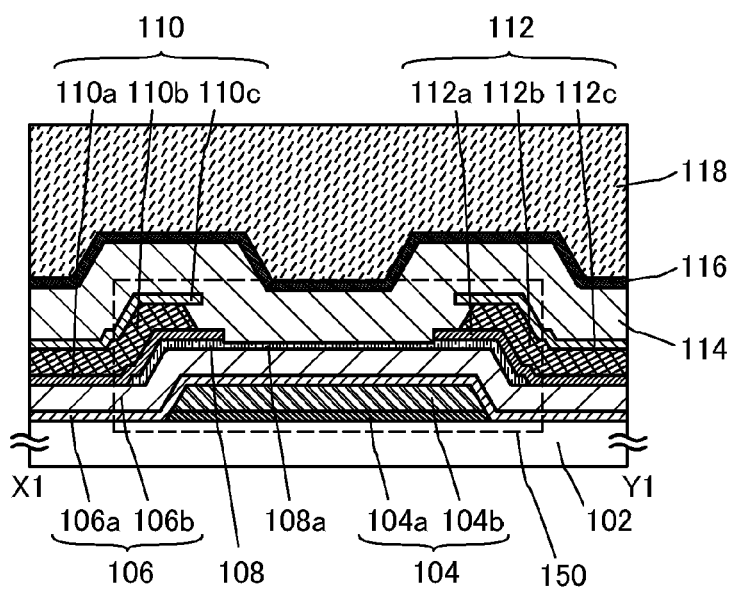

FIGS. 1A to 1C illustrate a structural example of a semiconductor device including a transistor 150. FIG. 1A is a plan view of the semiconductor device. FIG. 1B is a cross-sectional view taken along line X1-Y1 in FIG. 1A. FIG. 1C is a cross-sectional view taken along line V1-W1 in FIG. 1A. Note that in FIG. 1A, some components of the transistor 150 (e.g., a gate insulating film 106) are not illustrated for clarity.

The transistor 150 in FIGS. 1A to 1C includes a gate electrode 104 formed over a substrate 102, a gate insulating film 106 formed over the gate electrode 104, an oxide semiconductor film 108 in contact with the gate insulating film 106 and including a channel formation region 108a overlapping with the gate electrode 104, a source electrode 110 and a drain electrode 112 formed over the oxide semiconductor film 108, and an oxide insulating film 114 formed over the oxide semiconductor film 108, the source electrode 110, and the drain electrode 112. The source electrode 110 and the drain electrode 112 include first metal films 110a and 112a, second metal films 110b and 112b formed over the first metal films 110a and 112a, and third metal films 110c and 112c formed over the second metal films 110b and 112b. The second metal films 110b and 112b are formed on the inner side than end portions of the first metal films 110a and 112a and the third metal films 110c and 112c. The thickness of the channel formation region 108a (i.e., the oxide semiconductor film 108 which is not in contact with the first metal films 110a and 112a) is smaller than that of the oxide semiconductor film 108 in contact with the first metal films 110a and 112a. Note that details of the oxide semiconductor film 108 are described later.

The gate electrode 104 includes a first gate electrode 104a and a second gate electrode 104b. For the first gate electrode 104a, a metal or a metal nitride containing one or more elements selected from the group consisting of tungsten, tantalum, titanium, and molybdenum is preferably used. For the second gate electrode 104b, a metal material containing copper element is preferably used, more preferably, a metal material containing copper element as a main component (i.e., a metal material containing copper over 50 mass %). For example, in this embodiment, a tungsten film and a copper film are used as the first gate electrode 104a and the second gate electrode 104b, respectively. With such a stacked-layer structure, the gate electrode 104 can have low resistance. By providing the first gate electrode 104a, adhesion between the substrate 102 and the copper film used as the second gate electrode 104b can be improved and/or diffusion of copper element in the copper film used as the second gate electrode 104b can be prevented.

The gate insulating film 106 includes a first gate insulating film 106a and a second gate insulating film 106b. The first gate insulating film 106a has a function of preventing diffusion of copper element in the copper film used as the second gate electrode 104b. As the first gate insulating film 106a, a silicon nitride film, a silicon nitride oxide film, an aluminum oxide film, an aluminum nitride oxide film, or the like can be used. The second gate insulating film 106b has a function of supplying oxygen to the oxide semiconductor film 108 to be formed later. As the second gate insulating film 106b, a silicon oxide film, a silicon oxynitride film, or the like can be used. For example, in this embodiment, a silicon nitride film is used as the first gate insulating film 106a, and a silicon oxynitride film is used as the second gate insulating film 106b. With the gate insulating film 106 having such a stacked-layer structure, diffusion of copper element in the copper film used as the gate electrode 104 can be prevented and oxygen can be supplied to the oxide semiconductor film 108 to be formed later.

The source electrode 110 includes the first metal film 110a, the second metal film 110b, and the third metal film 110c. The drain electrode 112 includes the first metal film 112a, the second metal film 112b, and the third metal film 112c. Further, the second metal films 110b and 112b are formed on the inner side than the end portions of the first metal films 110a and 112a and the third metal films 110c and 112c.

As the first metal films 110a and 112a and the third metal films 110c and 112c, a metal or a metal nitride containing one or more elements selected from the group consisting of tungsten, tantalum, titanium, and molybdenum is preferably used. For each of the second metal films 110b and 112b, a metal material containing copper element is preferably used, more preferably, a metal material containing copper element as a main component.

For example, in this embodiment, a tungsten film is used as the first metal films 110a and 112a, a copper film is used as the second metal films 110b and 112b, and a molybdenum nitride film is used as the third metal films 110c and 112c.

The first metal films 110a and 112a and the third metal films 110c and 112c each function as a barrier metal for suppressing diffusion of copper element in the copper film used as the second metal films 110b and 112b. In addition, since the second metal films 110b and 112b are formed on the inner side than the first metal films 110a and 112a and the third metal films 110c and 112c, they are formed apart from the channel formation region 108a. Therefore, diffusion of copper element to the channel formation region 108a can be reduced.

With such a structure, the resistance of the source electrode 110 and the drain can be lowered and diffusion of copper element in the copper films used for the source electrode 110 and the drain electrode 112 to the outside can be prevented.

In addition, the thickness of the channel formation region 108a is smaller than that of the oxide semiconductor film 108 in contact with the first metal films 110a and 112a. With such a structure, for example, even if copper element is adhered to the oxide semiconductor film 108 when the source electrode 110 and the drain electrode 112 are formed, the copper element adhered in the formation of the source electrode 110 and the drain electrode 112 can be removed because the channel formation region 108a is formed by partially removing part of the oxide semiconductor film 108 to be thin.

In addition, since the oxide insulating film 114 is in contact with the oxide semiconductor film 108 (specifically, the channel formation region 108a), oxygen can be supplied to the oxide semiconductor film 108. Therefore, oxygen vacancies in the oxide semiconductor film 108 are filled with such oxygen supplied from the oxide insulating film 114.

In addition, the semiconductor device may further includes, over the oxide insulating film 114, a protective insulating film 116 and a planarization insulating film 118 formed over the protective insulating film 116. The protective insulating film 116 can suppress diffusion of oxygen contained in the oxide insulating film 114 to the outside. As the protective insulating film 116, an aluminum oxide film, a silicon nitride film, or the like can be used, for example. In this embodiment, an aluminum oxide film is used as the protective insulating film 116.

Note that details of the other components will be described in an example of a method for manufacturing a semiconductor device including the transistor 150 illustrated in FIGS. 1A to 1C with reference to FIGS. 2A to 2E and FIGS. 3A to 3D.

[Detailed Description of Oxide Semiconductor Film]

The oxide semiconductor film 108 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification and the like, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film).

Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Change and variation in threshold voltages can be suppressed. Thus, the transistor has high reliability.

In a crystal part or a crystalline oxide semiconductor film, defects in the bulk can be further reduced. Further, when the surface flatness of the crystal part or the crystalline oxide semiconductor film is enhanced, a transistor including the oxide semiconductor film can have higher field-effect mobility than a transistor including an amorphous oxide semiconductor film. In order to improve the surface flatness of the oxide semiconductor film, the oxide semiconductor film is preferably formed over a flat surface. Specifically, the oxide semiconductor is preferably formed over a surface with an average surface roughness (Ra) of less than or equal to 0.15 nm, preferably less than or equal to 0.1 nm.

Note that, Ra is obtained by three-dimension expansion of center line average roughness that is defined by JIS B 0601 so as to be applied to a plane. The Ra can be expressed as an "average value of the absolute values of deviations from a reference surface to a designated surface" and is defined by the formula below.

$$Ra = \frac{1}{S_0} \int_{y_1}^{y_2} \int_{x_1}^{x_2} |f(x, y) - Z_0| \, dx \, dy \qquad \text{[FORMULA 1]}$$

In Formula 1, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM).

For the oxide semiconductor film, an oxide semiconductor having a wider band gap than that of silicon, i.e., 1.1 eV, is preferably used. For example, an In—Ga—Zn-based oxide semiconductor having a band gap of 3.15 eV, indium oxide having a band gap of about 3.0 eV, indium tin oxide having a band gap of about 3.0 eV, indium gallium oxide having a band gap of about 3.3 eV, indium zinc oxide having a band gap of about 2.7 eV, tin oxide having a band gap of about 3.3 eV, zinc oxide having a band gap of about 3.37 eV, or the like can be preferably used. With the use of such a material, the off-state current of the transistor can be kept extremely low. Note that in one embodiment of the present invention, the band gap of the oxide semiconductor film is preferably more than or equal to 3.1 eV.

An oxide semiconductor used for the oxide semiconductor film preferably contains at least one selected from the group consisting of indium (In), zinc (Zn), and gallium (Ga). In particular, In and Zn are preferably contained. As a stabilizer for reducing a variation in electrical characteristics among transistors including the oxide semiconductor, tin (Sn) is preferably contained.

For example, as the oxide semiconductor, any of the following can be used: indium oxide; tin oxide; zinc oxide; a two-component metal oxide such as an In—Zn-based oxide, a Sn—Zn-based oxide, or In—Ga-based oxide; a three-component metal oxide such as an In—Ga—Zn-based oxide (also referred to as IGZO), In—Sn—Zn-based oxide, Sn—Ga—Zn-based oxide; and a four-component metal oxide such as an In—Sn—Ga—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer. Alternatively, as the oxide semiconductor, a material expressed by a chemical formula, $In_2SnO_5(ZnO)_n$ (n>0, n is a natural number) may be used.

For example, an In—Ga—Zn-based oxide with an atomic ratio where In:Ga:Zn=1:1:1, In:Ga:Zn=3:1:2, or In:Ga:Zn=2:1:3, or an oxide whose atomic ratio is in the neighborhood of the compositions can be used.

In a formation step of the oxide semiconductor film, it is preferable that hydrogen or water be contained in the oxide semiconductor film as little as possible. For example, it is preferable that the substrate be preheated in a preheating chamber of a sputtering apparatus as pretreatment for formation of the oxide semiconductor film so that an impurity such as hydrogen or moisture adsorbed to the substrate are eliminated and removed. Then, the oxide semiconductor film is preferably formed in a deposition chamber from which remaining moisture is removed.

In order to remove the moisture in the preheating chamber and the deposition chamber, an entrapment vacuum pump, for example, a cryopump, an ion pump, or a titanium sublimation pump is preferably used. Further, an evacuation unit may be a turbo pump provided with a cold trap. From the preheating chamber and the deposition chamber which is evacuated with a cryopump, a hydrogen atom, a compound containing a hydrogen atom such as water ($H_2O$) (more preferably, also a compound containing a carbon atom), and the like are removed, whereby the concentration of impurities such as hydrogen or moisture in the oxide semiconductor film that is to be formed can be reduced.

Note that an In—Ga—Zn-based oxide film is formed as the oxide semiconductor film by a sputtering method. The oxide semiconductor film can be formed by a sputtering method in a rare gas (typically argon) atmosphere, an oxygen atmosphere, or a mixed atmosphere of a rare gas and oxygen.

As a target used for forming an In—Ga—Zn-based oxide film as the oxide semiconductor film by a sputtering method, for example, a metal oxide target with an atomic ratio where In:Ga:Zn=1:1:1, a metal oxide target with an atomic ratio where In:Ga:Zn=3:1:2, or a metal oxide target with an atomic ratio where In:Ga:Zn=2:1:3 can be used. However, a material and composition of a target used for formation of the oxide semiconductor film is not limited to the above.

Further, when the oxide semiconductor film is formed using the above metal oxide target, the composition of the target is different from the composition of a film formed over the substrate in some cases. For example, when the metal oxide target of In:Ga:Zn=1:1:1 [atomic ratio] is used, the composition of the oxide semiconductor film, which is a thin film, becomes In:Ga:Zn=1:1:0.6 to 1:1:0.8 [atomic ratio] in some cases, although it depends on the film formation conditions. This is because in formation of the oxide semiconductor film, Zn is sublimed, or because the sputtering rate differs between the components of In, Ga, and Zn.

Accordingly, when a thin film having a preferable composition ratio is formed, a composition ratio of the metal oxide target needs to be adjusted in advance. For example, in order to make the composition of the oxide semiconductor film, which is a thin film, be In:Ga:Zn=1:1:1 [atomic ratio], the composition of the metal oxide target is preferably In:Ga:Zn=1:1:1.5 [atomic ratio]. In other words, the percentage of Zn content in the metal oxide target is preferably made higher in advance. The composition ratio of the target is not limited to the above value, and can be adjusted as appropriate depending on the film formation conditions or the composition of the thin film to be formed. Further, it is preferable to increase the percentage of Zn content in the metal oxide target because the obtained thin film can have higher crystallinity.

The relative density of the metal oxide target is 90% to 100%, preferably, 95% to 99.9%. By using the metal oxide target with high relative density, a dense oxide semiconductor film can be formed.

As a sputtering gas used for forming the oxide semiconductor film, it is preferable to use a high-purity gas from which impurities such as hydrogen, water, hydroxyl groups, or hydrides are removed.

There are three methods for forming a CAAC-OS film when the CAAC-OS film is used as the oxide semiconductor film. The first method is to form an oxide semiconductor film at a temperature higher than or equal to 100° C. and lower than or equal to 450° C. to form, in the oxide semiconductor film, crystal parts in which the c-axes are aligned in the direction parallel to a normal vector of a surface where the oxide semiconductor film is formed or a normal vector of a surface of the oxide semiconductor film. The second method is to form an oxide semiconductor film with a small thickness and then heat it at a temperature higher than or equal to 200° C. and lower than or equal to 700° C., to form, in the oxide semiconductor film, crystal parts in which the c-axes are aligned in the direction parallel to a normal vector of a surface where the oxide semiconductor film is formed or a normal vector of a surface of the oxide semiconductor film. The third method is to form a first oxide semiconductor film with a small thickness, then heat it at a temperature higher than or equal to 200° C. and lower than or equal to 700° C., and form a second oxide semiconductor film, to form, in the oxide semiconductor film, crystal parts in which the c-axes are aligned in the direction parallel to a normal vector of a surface where the oxide semiconductor film is formed or a normal vector of a surface of the oxide semiconductor film.

By heating the substrate during film formation, the concentration of an impurity such as hydrogen or water in the oxide semiconductor film formed can be reduced. In addition, damage by sputtering can be reduced, which is preferable. The oxide semiconductor film may be formed by an ALD (atomic layer deposition) method, an evaporation method, a coating method, or the like.

Note that when a crystalline (single-crystal or microcrystalline) oxide semiconductor film other than a CAAC-OS film is formed as the oxide semiconductor film, the film formation temperature and the temperature of heat treatment are not particularly limited.

As a method for processing the oxide semiconductor film, a wet etching method or a dry etching method can be used to etch the oxide semiconductor film. An etching gas such as $BCl_3$, $Cl_2$, or $O_2$ can be used in the dry etching method. Further, a dry etching apparatus using a high-density plasma source such as electron cyclotron resonance (ECR) or inductive coupled plasma (ICP) can be used to improve an etching rate.

After the oxide semiconductor film is formed, the oxide semiconductor film may be subjected to heat treatment. The temperature of the heat treatment is higher than or equal to 300° C. and lower than or equal to 700° C., or lower than the strain point of the substrate. Through the heat treatment, excess hydrogen (including water and a hydroxyl group) contained in the oxide semiconductor film can be removed. Note that the heat treatment is also referred to as dehydration treatment (dehydrogenation treatment) in this specification and the like in some cases.

The heat treatment can be performed in such a manner that, for example, an object to be processed is introduced into an electric furnace in which a resistance heater or the like is used and heated at 450° C. in a nitrogen atmosphere for one hour. The oxide semiconductor film is not exposed to the air during the heat treatment so that entry of water or hydrogen can be prevented.

Note that a heat treatment apparatus is not limited to an electric furnace, and may include a device for heating an object to be processed by heat conduction or heat radiation from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the heat treatment, GRTA treatment may be performed as follows. An object to be processed is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be switched to a gas including oxygen during the process.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The dehydration treatment (dehydrogenation treatment) might be accompanied by elimination of oxygen which is a main constituent material for an oxide semiconductor film to lead to a reduction in oxygen. An oxygen vacancy exists in a portion where oxygen is eliminated in an oxide semiconductor film, and a donor level which leads to a change in the electric characteristics of a transistor is formed owing to the oxygen vacancy. Therefore, in the case where the dehydration treatment (dehydrogenation treatment) is performed, oxygen is preferably supplied to the oxide semiconductor film. By supply of oxygen to the oxide semiconductor film, an oxygen vacancy in the film can be repaired.

The oxygen vacancy in the oxide semiconductor film can be filled in the following manner for example: after the oxide semiconductor film is subjected to the dehydration treatment (dehydrogenation treatment), a high-purity oxygen gas, a nitrous oxide gas, a high-purity nitrous oxide gas, or ultra dry air (the moisture amount is less than or equal to 20 ppm (−55° C. by conversion into a dew point), preferably less than or equal to 1 ppm, further preferably less than or equal to 10 ppb, in the measurement with the use of a dew point meter of a cavity ring down laser spectroscopy (CRDS) system) is introduced into the same furnace. It is preferable that water, hydrogen, and the like not be contained in the oxygen gas or the nitrous oxide gas. The purity of the oxygen gas or the nitrous oxide gas which is introduced into the heat treatment apparatus is preferably 6N (99.9999%) or more, further preferably 7N (99.99999%) or more (i.e., the impurity concentration in the oxygen gas or the nitrous oxide gas is preferably less than or equal to 1 ppm, further preferably less than or equal to 0.1 ppm).

As an example of a method of supplying oxygen to the oxide semiconductor film, oxygen (including at least any one of oxygen radicals, oxygen atoms, and oxygen ions) is added to the oxide semiconductor film in order to supply oxygen to the oxide semiconductor film. An ion implantation method, an ion doping method, a plasma immersion ion implantation method, plasma treatment, or the like can be used as a method for adding oxygen.

As another example of a method for supplying oxygen to the oxide semiconductor film, oxygen may be supplied to the oxide semiconductor film in such a manner that the base insulating film, the gate insulating film to be formed later, or the like is heated and part of oxygen is released.

As described above, after formation of the oxide semiconductor film, it is preferable that dehydration treatment (dehydrogenation treatment) be performed to remove hydrogen or moisture from the oxide semiconductor film, so that the oxide semiconductor film is highly purified so as to include as few impurities as possible, and oxygen whose amount is reduced in the dehydration treatment (dehydrogenation treatment) be added to the oxide semiconductor or oxygen be supplied excessively to fill the oxygen vacancies in the oxide semiconductor film. Further, supplying oxygen to the oxide semiconductor film may be expressed as oxygen adding treatment or oxygen supplying treatment.

In this manner, hydrogen or moisture is removed from the oxide semiconductor film by dehydration treatment (dehydrogenation treatment) and oxygen vacancies therein are filled by oxygen adding treatment, whereby the oxide semiconductor film can be turned into an electrically i-type (intrinsic) or substantially i-type oxide semiconductor film. Specifically, the concentration of hydrogen in the oxide semiconductor film, which is measured by SIMS, is lower than or equal to $5\times10^{19}$ atoms/cm$^3$, preferably lower than or equal to $5\times10^{18}$ atoms/cm$^3$, more preferably lower than or equal to $5\times10^{17}$ atoms/cm$^3$. Note that the concentration of hydrogen in the oxide semiconductor film is measured by secondary ion mass spectrometry (SIMS).

The number of carriers generated due to a donor in the oxide semiconductor film, in which hydrogen concentration is reduced to a sufficiently low concentration so that the oxide semiconductor film is purified and in which defect states in an energy gap due to oxygen deficiency are reduced by sufficiently supplying oxygen as described above, is very small (close to zero); the carrier concentration in the oxide semiconductor film is less than $1\times10^{12}$/cm$^3$, preferably less than $1\times10^{11}$/cm$^3$, further preferably less than $1.45\times10^{10}$/cm$^3$. In a transistor including such an oxide semiconductor film, the off-state current (per unit channel width (1 mm) here) at room temperature (25° C.), for example, is less than or equal to 100 zA (1 zA (zeptoampere) is $1\times10^{-21}$ A), preferably less than or equal to 10 zA, more preferably less than or equal to 100 yA (1 yA (yoctoampere) is $1\times10^{-24}$ A). The transistor with very excellent off-state current characteristics can be obtained with the use of such an i-type (intrinsic) or substantially i-type oxide semiconductor.

[Method 1 for Manufacturing Semiconductor Device]

Figure 2A:
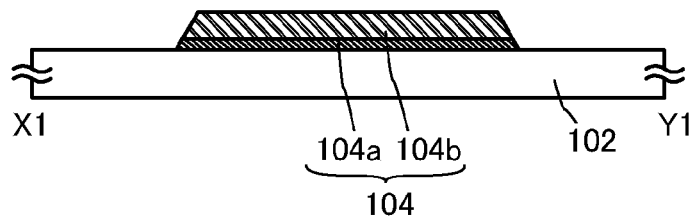
FIGS. 2A to 2E are cross-sectional views illustrating a method for manufacturing the semiconductor device shown in FIGS. 1A to 1C.

First, the gate electrode 104 including the first gate electrode 104*a* and the second gate electrode 104*b* is formed over the substrate 102 (see FIG. 2A).

There is no particular limitation on the substrate 102, as long as it has heat resistance high enough to withstand heat treatment performed later. A variety of glass substrates for electronics industry, such as a barium borosilicate glass substrate and an aluminoborosilicate glass substrate, can be used as the substrate. Note that a substrate having a thermal expansion coefficient greater than or equal to $25\times10^{-7}$/° C. and less than or equal to $50\times10^{-7}$/° C. (preferably greater than or equal to $30\times10^{-7}$/° C. and less than or equal to $40\times10^{-7}$/° C.) and a strain point higher than or equal to 650° C. and lower than or equal to 750° C. (preferably higher than or equal to 700° C. and lower than or equal to 740° C.) is preferably used.

In the case where a large-sized substrate having the size of the fifth generation (1000 mm×1200 mm or 1300 mm×1500 mm), the sixth generation (1500 mm×1800 mm), the seventh generation (1870 mm×2200 mm), the eighth generation (2200 mm×2500 mm), the ninth generation (2400 mm×2800 mm), the tenth generation (2880 mm×3130 mm), or the like is used, minute processing might become difficult owing to shrinkage of the substrate caused by heat treatment or the like in the manufacturing process of a semiconductor device. Therefore, when such a large-sized glass substrate is used as the substrate, the one with a small shrinkage is preferably used. For example, a large-sized glass substrate which has a shrinkage of 20 ppm or less, preferably 10 ppm or less, further preferably 5 ppm or less after heat treatment preferably at 450° C., further preferably at 500° C. for one hour may be used as the substrate.

Further, a base insulating film may be provided over the substrate 102. The base insulating film can be formed by a plasma CVD method, a sputtering method, or the like using an oxide insulating film such as a silicon oxide film, a silicon oxynitride film, an aluminum oxide film, an aluminum oxynitride film, a hafnium oxide film, or a gallium oxide film; a nitride insulating film such as a silicon nitride film, a silicon nitride oxide film, an aluminum nitride film, or an aluminum nitride oxide film; or a mixed material thereof.

The gate electrode 104 (the first gate electrode 104a and the second gate electrode 104b) can be formed using a material containing one or more elements selected from the group consisting of tungsten, tantalum, titanium, molybdenum, and copper. In this embodiment, a tantalum nitride film with a thickness of 20 nm to 100 nm and a copper film with a thickness of 100 nm to 400 nm are formed by a sputtering method as the first gate electrode 104a and the second gate electrode 104b, respectively. By providing the first gate electrode 104a, the adhesion with the copper film used for the second gate electrode 104b can be improved.

Note that the gate electrode 104 in this embodiment has a stacked-layer structure of the first gate electrode 104a and the second gate electrode 104b; however, the present invention is not limited to this structure. For example, a third gate electrode may be provided over the second gate electrode 104b. As the third gate electrode, a material similar to that of the first gate electrode 104a can be used.

Figure 2B:
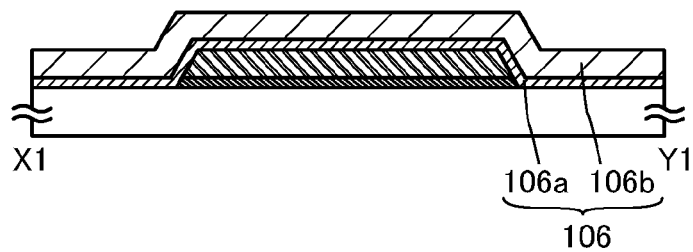

Next, the gate insulating film 106 including the first gate insulating film 106a and the second gate insulating film 106b is formed over the substrate 102 and the gate electrode 104 (see FIG. 2B).

For the first gate insulating film 106a, a nitride insulating film formed by a plasma CVD method, a sputtering method, or the like is preferably used. The thickness of the nitride insulating film is preferably greater than or equal to 10 nm and less than or equal to 500 nm, typically greater than or equal to 200 nm and less than or equal to 400 nm. As the nitride insulating film, a silicon nitride film, a silicon nitride oxide film, and the like are given. The nitride insulating film is used as the first gate insulating film 106a which is in contact with the substrate 102 and the gate electrode 104, thereby preventing diffusion of impurities from the substrate 102 and the gate electrode 104. In particular, in the case where a metal material containing a copper element is used as the gate electrode 104 (more specifically, the second gate electrode 104b), copper element which might be diffused to the transistor can be reduced owing to the first gate insulating film 106a.

In this embodiment, as the first gate insulating film 106a, a 50-nm-thick silicon nitride film formed by a plasma CVD method is used. As a gas used for forming the silicon nitride film, a mixed gas of silane ($SiH_4$) and nitrogen, a mixed gas of silane, nitrogen, and ammonia ($NH_3$), or the like can be used.

For the second gate insulating film 106b, an oxide insulating film formed by a plasma CVD method, a sputtering method, or the like is preferably used. The thickness of the oxide insulating film is preferably greater than or equal to 10 nm and less than or equal to 500 nm, typically greater than or equal to 50 nm and less than or equal to 100 nm. As the oxide insulating film, a silicon oxide film, a gallium oxide film, an aluminum oxide film, a silicon oxynitride film, an aluminum oxynitride film are given.

In this embodiment, as the second gate insulating film 106b, a 200-nm-thick silicon oxynitride film formed by a plasma CVD method is used. The deposition cycle in the case of using a plasma CVD method can be made shorter than that of the case of using a sputtering method. In addition, in the case of using a CVD method, variation in film quality of the deposited plane is small and particles are less likely to enter the silicon oxynitride film, as compared with the case of using a sputtering method.

Note that since the second gate insulating film 106b is an insulating film in contact with the oxide semiconductor film 108 formed later, it is preferable to contain oxygen and also preferable to contain impurities such as water or hydrogen as little as possible. In the case of using a plasma CVD method, it is more difficult to reduce the concentration of hydrogen in the layer than the case of using a sputtering method. Thus, heat treatment for reducing (preferably, removing) hydrogen atoms (the treatment is dehydration or dehydrogenation treatment) may be performed on the second gate insulating film 106b.

The heat treatment is performed at a temperature higher than or equal to 250° C. and lower than or equal to 650° C., preferably higher than or equal to 450° C. and lower than or equal to 600° C. or lower than the strain point of the substrate 102. As the heat treatment, for example, the substrate is introduced into an electric furnace which is one of heat treatment apparatuses, and heat treatment is performed on the gate insulating film 106 at 650° C. for one hour in vacuum (under reduced pressure).

Note that the heat treatment apparatus is not limited to the electric furnace, and an apparatus for heating an object by heat conduction or heat radiation from a heater such as a resistance heater may be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high temperature gas, an inert gas which does not react with an object by heat treatment, such as nitrogen or a rare gas like argon, is used. Note that in the case where a GRTA apparatus is used as the heat treatment apparatus, the substrate may be heated in an inert gas heated to high temperature of 650° C. to 700° C. because the heat treatment time is short.

The heat treatment may be performed under an atmosphere of nitrogen, oxygen, ultra-dry air (air in which a water content is 20 ppm or lower, preferably 1 ppm or lower, more preferably 10 ppb or lower), or a rare gas (argon, helium, or the like). Note that it is preferable that water, hydrogen, or the like be not contained in the atmosphere of nitrogen, oxygen, ultra-dry air, or a rare gas. It is also preferable that the purity of nitrogen, oxygen, or the rare gas which is introduced into a heat treatment apparatus be set to be 6N (99.9999%) or higher, preferably 7N (99.99999%) or higher (that is, the impurity concentration is 1 ppm or lower, preferably 0.1 ppm or lower).

With the heat treatment, dehydration or dehydrogenation can be performed on the gate insulating film 106, so that the gate insulating film 106 from which impurities such as hydrogen and water causing variation in the characteristics of the transistor are removed can be formed.

The heat treatment for dehydration or dehydrogenation may be performed plural times, and may also serve as another heat treatment.

Figure 2C:
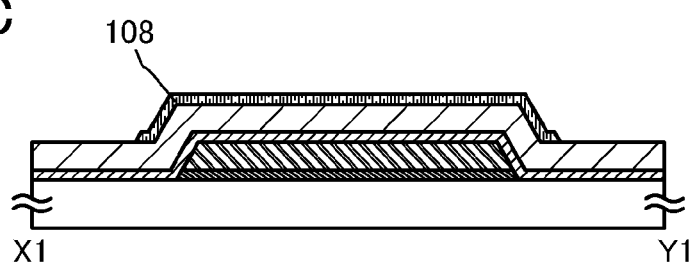

Next, the oxide semiconductor film 108 is formed in contact with the gate insulating film 106 so as to overlap with the gate electrode 104 (see FIG. 2C).

Further, after the oxide semiconductor film 108 is formed, the oxide semiconductor film 108 is preferably subjected to heat treatment for reducing or removing excess hydrogen (including water and a hydroxyl group) contained in the oxide semiconductor film 108 (dehydration or dehydrogenation). The heat treatment can be performed in a condition similar to that of the heat treatment of the second gate insulating film 106b described above.

The heat treatment enables reduction, more preferably removal of hydrogen, which is an impurity imparting n-type conductivity, in the oxide semiconductor film 108. Further, in the case where an insulating film containing oxygen is used as the second gate insulating film 106b, by this heat treatment, oxygen contained in the second gate insulating film 106b can be supplied to the oxide semiconductor film 108. While oxygen is released from the oxide semiconductor film 108 by the dehydration or dehydrogenation treatment, oxygen is supplied from the second gate insulating film 106b to the oxide semiconductor film 108, whereby oxygen vacancies in the oxide semiconductor film 108 can be filled.

Further, after the oxide semiconductor film 108 is heated through the heat treatment, a high-purity oxygen gas, a high-purity nitrous oxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew-point instrument of a cavity ring down laser spectroscopy (CRDS) system) may be introduced into the same furnace while the heating temperature is maintained or gradually decreased. It is preferable that the oxygen gas or the nitrous oxide gas do not contain water, hydrogen, and the like. Alternatively, the purity of an oxygen gas or a nitrous oxide gas which is introduced into the heat treatment apparatus is preferably 6N or higher, more preferably 7N or higher (that is, the impurity concentration of the oxygen gas or the nitrous oxide gas is 1 ppm or lower, preferably 0.1 ppm or lower). While oxygen is reduced by removing an impurity for the dehydration or dehydrogenation, the oxygen gas or the nitrous oxide gas acts to supply oxygen that is a main component of the oxide semiconductor film 108, so that the oxide semiconductor film 108 can have high purity and be an i-type (intrinsic) oxide semiconductor film.

The heat treatment for dehydration or dehydrogenation may serve as another heat treatment of a manufacturing process of the transistor 150.

Figure 2D:
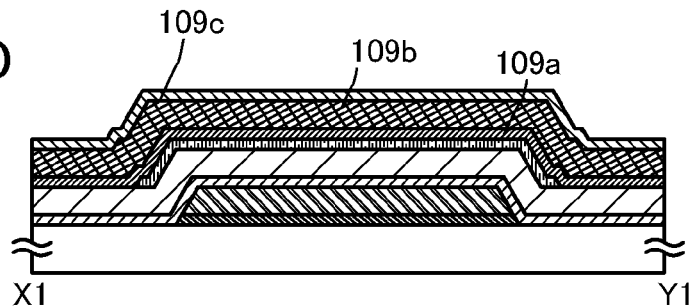

Next, a first metal film 109a, a second metal film 109b, and a third metal film 109c which are to be a source electrode and a drain electrode (as well as a wiring formed in the same layer as the source electrode and the drain electrode) are formed over the gate insulating film 106 and the oxide semiconductor film 108 (see FIG. 2D).

The first metal film 109a is preferably a metal film or a metal nitride film containing one or more elements selected from the group consisting of tungsten, tantalum, titanium, and molybdenum. In this embodiment, as the first metal film 109a, a 50-nm-thick tungsten film formed by a sputtering method is used.

Further, the first metal film 109a may have a stacked-layer structure. For example, the stacked-layer structure includes a metal film containing one or more elements selected from the group consisting of tungsten, tantalum, titanium, and molybdenum as a first layer of the first metal film 109a, and a metal nitride film containing one or more elements selected from the group consisting of tungsten nitride, tantalum nitride, titanium nitride and molybdenum nitride as a second layer of the first metal film 109a.

As the properties required of the material of the first metal film 109a, the following material is preferable. Since the first metal film 109a is in contact with the oxide semiconductor film 108, a material which does not extract oxygen from the oxide semiconductor film 108 not to turn the oxide semiconductor film 108 into n-type, the material (so-called barrier metal material) which suppresses diffusion of copper element from the copper film used as the second metal film 109b to the oxide semiconductor film 108 is preferably used.

The second metal film 109b preferably contains copper element. Note that a copper alloy or the like in which aluminum, gold, silver, zinc, tin, nickel, or the like is added at several weight percent to copper may be used. In this embodiment, as the second metal film 109b, a 200-nm-thick copper film formed by a sputtering method is used.

The third metal film 109c can be formed using a method and a material similar to those of the first metal film 109a.

Figure 2E:
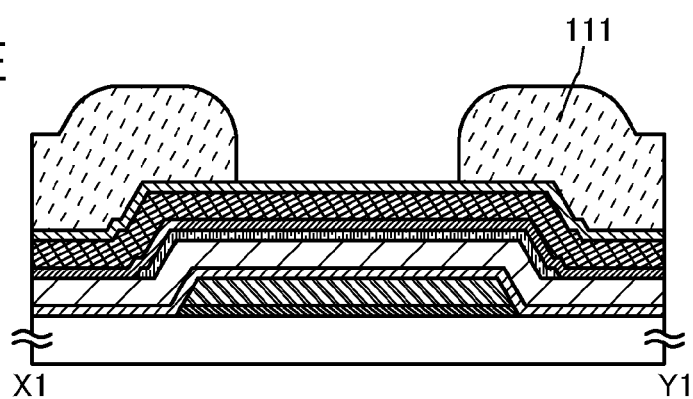

Next, a resist is applied over the third metal film 109c and patterning is performed, whereby a resist mask 111 as an etching mask is formed (see FIG. 2E).

The resist mask 111 can be formed in such a manner that a photosensitive resin is applied and then is exposed and developed in a desired region. Note that the photosensitive resin may be a negative-type or positive-type photosensitive resin. Alternatively, the resist mask 111 may be formed with an ink-jet method. The manufacturing cost can be reduced because a photomask is not used when the resist mask 111 is formed by an ink-jet method.

Figure 3A:
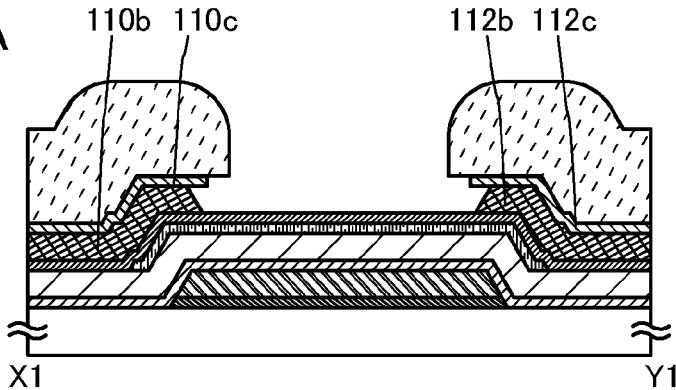
FIGS. 3A to 3D are cross-sectional views illustrating a method for manufacturing the semiconductor device shown in FIGS. 1A to 1C.

Next, part of each of the third metal film 109c and the second metal film 109b is removed by the first etching using the resist mask 111 as a mask, whereby the third metal films 110c and 112c and the second metal films 110b and 112b are formed (see FIG. 3A).

As a method for removing the second metal film 109b and the third metal film 109c, a wet etching method is preferable. As a chemical solution used in the wet etching method, it is preferable that a chemical solution which can have a selection ratio between the first metal film 109a be used. For example, in the case where a tungsten film is used as the first metal film 109a, a copper film is used as the second metal film 109b, and a molybdenum nitride film is used as the third metal film 109c; a mixed solution of water, hydrogen peroxide water, and carboxylic acid; a mixed solution of water, phosphoric acid, nitric acid, sulfuric acid, and potassium sulfate; or the like can be used as the chemical solution.

Further, by adjusting wet etching time and performing isotropic etching, the side surfaces of the second metal films 110b and 112b is preferably reduced to the inner side than the resist mask 111. Further, the second metal films 110b and 112b are preferably formed on the inner side than the third metal films 110c and 112c.

Figure 3B:
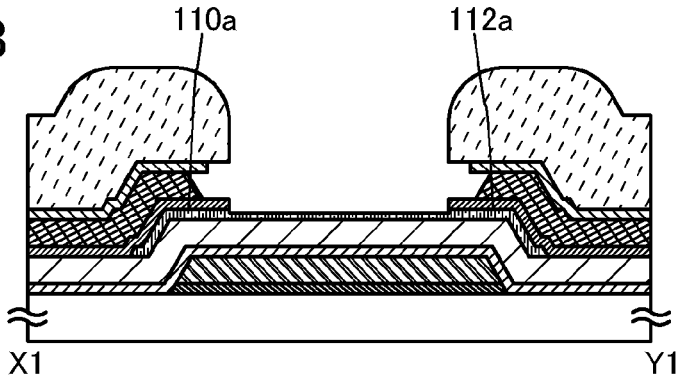

Next, part of the first metal film 109a is removed by the second etching using the resist mask 111 as a mask, whereby the first metal films 110a and 112a are formed (see FIG. 3B).

Note that the first metal film 109a is removed by the second etching so that the removed portions are on the outer side of the end portions on the channel formation region side of the second metal film 110b and the second metal film 112b which are patterned by the first etching.

As a method for removing the first metal film 109a, a dry etching method is preferably used. As a gas used for the dry etching method, for example, in the case where a tungsten film is used as the first metal film 109a, a mixed gas containing $SF_6$ and $O_2$, a mixed gas containing $SF_6$ and $BCl_3$, or the like can be used.

In addition, in the second etching for the first metal film 109a, part of the oxide semiconductor film 108 is removed, whereby the channel formation region 108a is formed. With such a structure, copper element which might enter the oxide semiconductor film 108 in the formation of the second metal films 110b and 112b can be removed from the oxide semiconductor film 108.

Next, the resist mask 111 is removed, and the source electrode 110 including the first metal film 110a, the second metal film 110b, and the third metal film 110c and the drain electrode 112 including the first metal film 112a, the second metal film 112b, and the third metal film 112c are formed. At this stage, the transistor 150 is formed (see FIG. 3C).

As a method for removing the resist mask 111, a wet removing method using a stripping solution, a dry removing method such as plasma treatment, a combination thereof, or the like can be used.

Note that after the source electrode 110 and the drain electrode 112 are formed, the oxide semiconductor film 108 (more specifically, the channel formation region 108a) is preferably cleaned. The oxide semiconductor film 108 is effectively cleaned by oxygen plasma treatment, cleaning treatment by treatment with dilute hydrofluoric acid, or the like. By performing such a cleaning, an etching gas component used in forming the source electrode 110 and the drain electrode 112, a residue of the resist mask 111, a residue of the second metal films 110b, or the like can be removed from the oxide semiconductor film 108, so that the oxide semiconductor film 108 can be more purified.

Further, after the source electrode 110 and the drain electrode 112 are formed, heart treatment may be performed. The heat treatment is performed at a temperature higher than or equal to 250° C. and lower than or equal to 650° C., preferably higher than or equal to 450° C. and lower than or equal to 600° C., or lower than the strain point of the substrate.

Figure 3C:
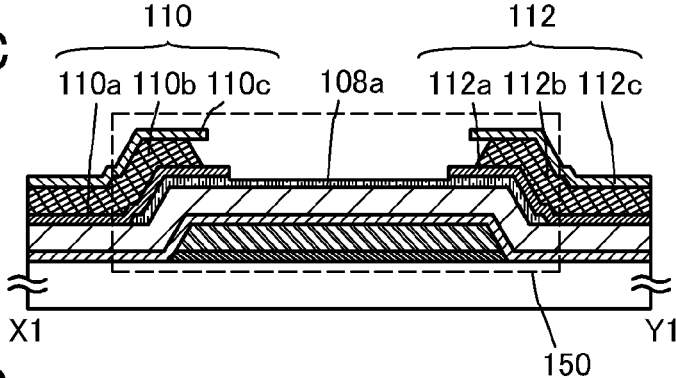
Figure 3D:
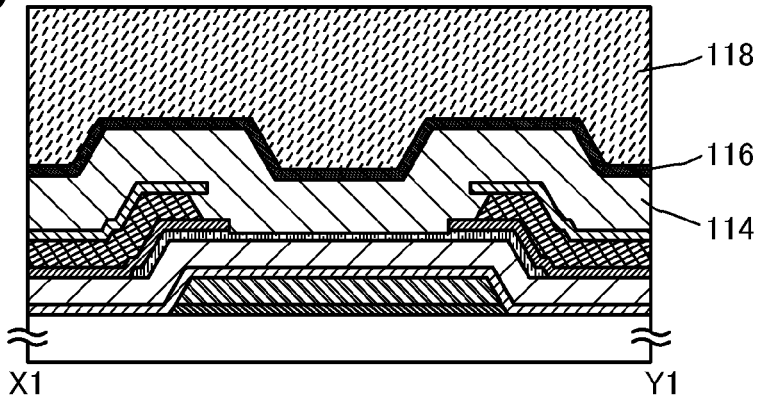

Then, the oxide insulating film 114, the protective insulating film 116, and the planarization insulating film 118 are formed over the transistor 150, more specifically, over the channel formation region 108a, the source electrode 110, and the drain electrode 112 (see FIG. 3D).

The oxide insulating film 114 can be formed using an oxide insulating film such as a silicon oxide film, a gallium oxide film, an aluminum oxide film, a silicon oxynitride film, or an aluminum oxynitride film by a plasma CVD method or a sputtering method. The thickness of the oxide insulating film 114 is preferably greater than or equal to 50 nm and less than or equal to 500 nm.

Further, the oxide insulating film 114 is preferably an oxygen-excess oxide insulating film. With the oxygen-excess oxide insulating film, oxygen can be efficiently supplied to the oxide semiconductor film 108.

Further, the oxide insulating film 114 can be a single layer or a stacked layer. For example, when a second oxide insulating film is formed over a first oxide insulating film, the composition ratio of the first oxide insulating film can be different from that of the second oxide insulating film.

Note that the oxide insulating film 114 preferably contains impurities such as water or hydrogen as little as possible like the gate insulating film 106 because the oxide insulating film 114 is an insulating film in contact with oxide semiconductor film 108.

In addition, treatment for adding oxygen may be performed on the oxide insulating film 114.

As the treatment for adding oxygen, an ion implantation method, an ion doping method, a plasma immersion ion implantation method, plasma treatment, or the like can be used. Note that as an ion implantation method, a gas cluster ion beam may be used. The oxygen-introducing treatment may be performed for the entire surface of the substrate 102 by one step or may be performed using a linear ion beam, for example.

The oxygen contains at least any of an oxygen radical, ozone, an oxygen atom, and an oxygen ion (an oxygen molecular ion and/or an oxygen cluster ion). As a gas for supplying the oxygen, a gas containing oxygen (O) is used. For example, an $O_2$ gas, an $N_2O$ gas, a $CO_2$ gas, a CO gas, a $NO_2$ gas, or the like can be used. Note that a rare gas (e.g., an Ar gas) may be contained in the supply gas of the oxygen.

Further, in the case where an ion implantation method is used for introducing oxygen, the dose of the oxygen is preferably greater than or equal to $1 \times 10^{13}$ ions/cm$^2$ and less than or equal to $5 \times 10^{16}$ ions/cm$^2$. The content of oxygen in the oxide insulating film 114 after the oxygen-introducing treatment preferably exceeds that of the stoichiometric composition of the oxide insulating film 114. The depth at which oxygen is implanted may be adjusted as appropriate by implantation conditions.

The protective insulating film 116 can be formed by a plasma CVD method or a sputtering method using a silicon oxide film, a gallium oxide film, an aluminum oxide film, a silicon nitride film, a silicon oxynitride film, an aluminum oxynitride film, a silicon nitride oxide film, or the like. The thickness of the protective insulating film 116 is preferably greater than or equal to 50 nm and less than or equal to 500 nm.

Note that like the oxide insulating film 114, the protective insulating film 116 preferably contains impurities such as water or hydrogen as little as possible. Thus, in this embodiment, after formation of the protective insulating film 116, heat treatment for removing hydrogen atoms (for dehydration or dehydrogenation) is performed thereon.

The temperature of heat treatment can be, for example, higher than or equal to 250° C. and lower than or equal to 600° C., preferably higher than or equal to 300° C. and lower than or equal to 600° C. In this embodiment, heat treatment is performed at 350° C. for one hour.

As the planarization insulating film 118, a material is used so that the uneven surface of the transistor 150 can be flat. For example, a heat-resistant organic material such as a polyimide resin, an acrylic resin, a polyimide amide resin, a benzocyclobutene resin, a polyamide resin, or an epoxy resin can be used. Other than such organic materials, a low-dielectric constant material (a low-k material), a siloxane-based resin, or the like can be used. Note that the planarization insulating film 118 may be formed by stacking a plurality of insulating films formed using any of these materials. In this embodiment, an acrylic-based resin film with a thickness of 1.5 μm is used as the planarization insulating film 118.

[Structural Example 2 of Semiconductor Device]

Figure 4A:
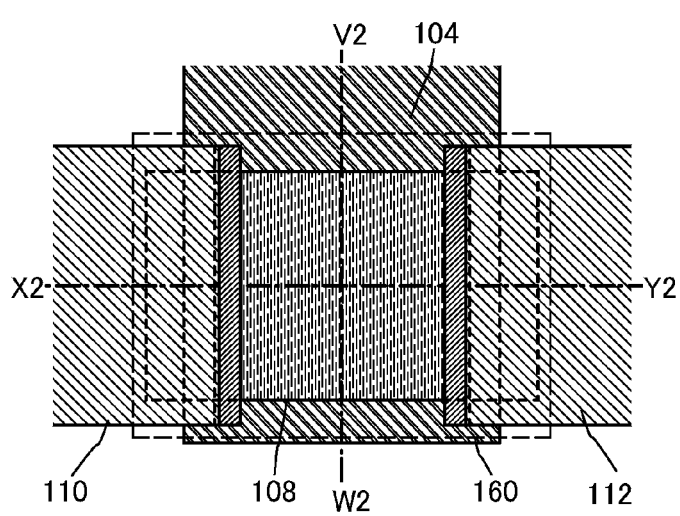
FIGS. 4A to 4C are a plan view illustrating a structural example 2 of a semiconductor device, a cross-sectional view taken along line X2-Y2 in FIG. 4A, and a cross-sectional view taken along line V2-W2 in FIG. 4A, respectively.
Figure 4C:
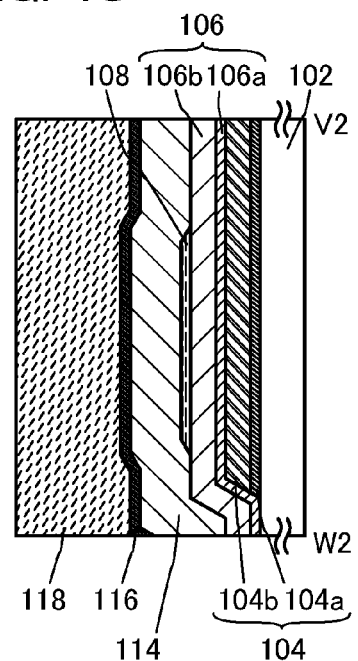
Figure 4B:
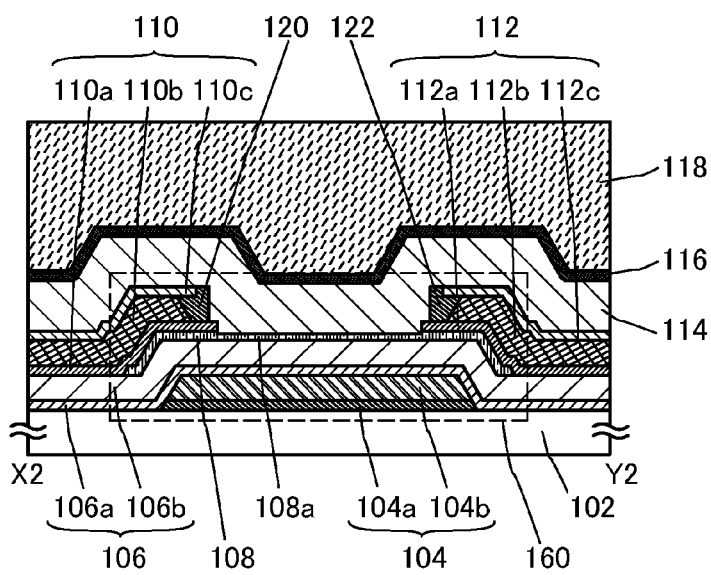

FIGS. 4A to 4C illustrate a structural example of a semiconductor device including a transistor 160. FIG. 4A is a plan view of the semiconductor device. FIG. 4B is a cross-sectional view taken along X2-Y2 in FIG. 4A. FIG. 4C is a cross-sectional view taken along V2-W2 in FIG. 4A. Note that in FIG. 4A, some components of the transistor 160 (e.g., a gate insulating film 106) are not illustrated for clarity.

The transistor 160 in FIGS. 4A to 4C includes a gate electrode 104 formed over a substrate 102; a gate insulating film 106 formed over the gate electrode 104; an oxide semiconductor film 108 in contact with the gate insulating film 106 and including a channel formation region 108a overlapping with the gate electrode 104; a source electrode 110 and a drain electrode 112 formed over the oxide semiconductor film 108; sidewall protective films 120 and 122 formed on sidewalls of the source electrode 110 and the drain electrode 112, respectively; and an oxide insulating film 114 formed over the oxide semiconductor film 108, the source electrode 110, the drain electrode 112, and the sidewall protective films 120 and 122.

The source electrode 110 and the drain electrode 112 include first metal films 110a and 112a, second metal films 110b and 112b formed over the first metal films 110a and 112a, and third metal films 110c and 112c formed over the second metal films 110b and 112b. The second metal films 110b and 112b are formed on the inner side than each of the end portions of the first metal films 110a and 112a and the third metal films 110c and 112c. The thickness of the channel formation region 108a (i.e., the oxide semiconductor film 108 not in contact with the first metal films 110a and 112a) is smaller than that of the oxide semiconductor film 108 in contact with the first metal films 110a and 112a.

The gate electrode 104 includes a first gate electrode 104a and a second gate electrode 104b. As the first gate electrode 104a, a metal or a metal nitride containing one or more elements selected from the group consisting of tungsten, tantalum, titanium, and molybdenum is preferably used. For the second gate electrode 104b, a metal material containing copper element is preferably used, more preferably, a metal material containing copper element as a main component. For example, in this embodiment, a tungsten film and a copper film are used as the first gate electrode 104a and the second gate electrode 104b, respectively. With such a stacked-layer structure, the resistance of the gate electrode 104 can be lowered. By providing the first gate electrode 104a, adhesion between the substrate 102 and the copper film used as the second gate electrode 104b can be improved and/or diffusion of copper element in the copper film used as the second gate electrode 104b can be prevented.

The gate insulating film 106 includes a first gate insulating film 106a and a second gate insulating film 106b. The first gate insulating film 106a has a function of preventing diffusion of copper element in the copper film used as the second gate electrode 104b. As the first gate insulating film 106a, a silicon nitride film, a silicon nitride oxide film, an aluminum oxide film, an aluminum nitride oxide film, or the like can be used. In addition, the second gate insulating film 106b has a function of supplying oxygen to the oxide semiconductor film 108 which is formed later. As the second gate insulating film 106b, a silicon oxide film, a silicon oxynitride film, or the like can be used. For example, in this embodiment, a silicon nitride film is used as the first gate insulating film 106a, and a silicon oxynitride film is used as the second gate insulating film 106b. With the gate insulating film 106 having such a stacked-layer structure, diffusion of copper element in the copper film used as the gate electrode 104 can be prevented and oxygen can be supplied to the oxide semiconductor film to be formed later.

The source electrode 110 includes a first metal film 110a, a second metal film 110b, and a third metal film 110c. The drain electrode 112 includes a first metal film 112a, a second metal film 112b, and a third metal film 112c. Further, the second metal films 110b and 112b are formed on the inner side than end portions of the first metal films 110a and 112a and the third metal films 110c and 112c.

As the first metal films 110a and 112a and the third metal films 110c and 112c, a metal or a metal nitride containing one or more elements selected from the group consisting of tungsten, tantalum, titanium, and molybdenum is preferably used. For each of the second metal films 110b and 112b, a metal material containing copper element is preferably used, more preferably, a metal material containing copper element as a main component.

For example, in this embodiment, a tungsten film is used as the first metal film 110a and the first metal film 112a, a copper film is used as the second metal film 110b and the second metal film 112b, and a molybdenum nitride film is used as the third metal film 110c and the third metal film 112c.

The first metal films 110a and 112a and the third metal films 110c and 112c each function as a barrier metal for suppressing diffusion of copper element in the copper film used as the second metal films 110b and 112b. In addition, since the second metal films 110b and 112b are formed on the inner side than the first metal films 110a and 112a and the third metal films 110c and 112c, they are formed apart from the channel formation region 108a. Therefore, diffusion of copper element to the channel formation region 108a can be reduced.

In addition, the transistor 160 includes the sidewall protective films 120 and 122 formed on sidewalls of the source electrode 110 and the drain electrode 112, respectively. With such a structure, diffusion of copper element in the copper film used as the second metal films 110b and 112b can be suppressed also in the longitudinal direction. Further, the sidewall protective films 120 and 122 can be formed in a self-aligned manner after the source electrode 110 and the drain electrode 112 are formed. Thus, the sidewall protective films 120 and 122 can be formed without a patterning step and the like, and accordingly, the manufacturing cost can be reduced.

With such a structure, the source electrode 110 and the drain electrode 112 can have low resistance and diffusion of copper element in the copper film used in the source electrode 110 and the drain electrode 112 to the outside can be prevented.

In addition, the thickness of the channel formation region 108a is smaller than that of the oxide semiconductor film 108 in contact with the first metal films 110a and 112a. With such a structure, for example, even if copper element is adhered to the oxide semiconductor film 108 when the source electrode 110 and the drain electrode 112 are formed, the copper element adhered in the formation of the source electrode 110 and the drain electrode 112 can be removed because the channel formation region 108a is formed by partially removing part of the oxide semiconductor film 108 to be thin.

In addition, since the oxide insulating film 114 is in contact with the oxide semiconductor film 108 (specifically, the channel formation region 108a), oxygen can be supplied to the oxide semiconductor film 108. Therefore, oxygen vacancies in the oxide semiconductor film 108 are filled with such oxygen supplied from the oxide insulating film 114.

In addition, the semiconductor device may further includes, over the oxide insulating film 114, a protective insulating film 116 and a planarization insulating film 118 formed over the protective insulating film 116. The protective insulating film 116 can suppress diffusion of oxygen contained in the oxide insulating film 114 to the outside. As the protective insulating film 116, an aluminum oxide film, a silicon nitride film, or the like can be used, for example. In this embodiment, an aluminum oxide film is used as the protective insulating film 116.

Note that details of the other components will be described in an example of a method for manufacturing a semiconductor device including the transistor 160 illustrated in FIGS. 4A to 4C with reference to FIGS. 5A to 5D.

[Method 2 for Manufacturing Semiconductor Device]

Figure 5A:
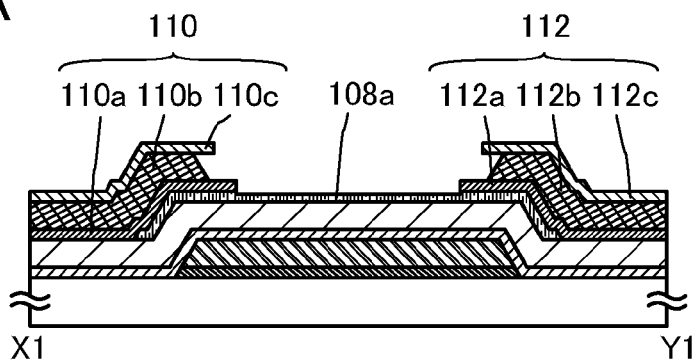
FIGS. 5A to 5D are cross-sectional views illustrating a method for manufacturing the semiconductor device shown in FIGS. 4A to 4C.

A transistor illustrated in FIG. 5A is manufactured in the steps similar to those in the method for manufacturing the transistor 150 in FIG. 3C (see FIG. 5A).

Figure 5B:
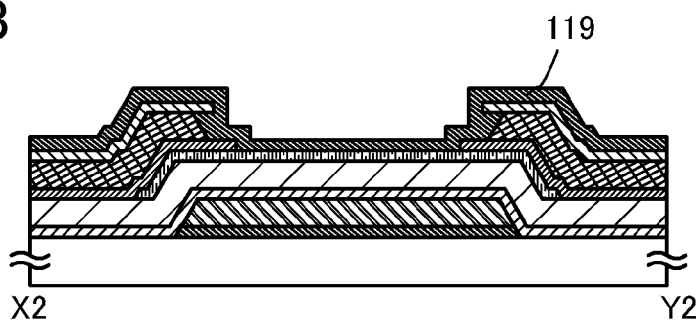

Next, a protective film 119 serving as a sidewall protective film is formed over the oxide semiconductor film 108, the source electrode 110, and the drain electrode 112 (see FIG. 5B).

As the protective film 119, an aluminum oxide film, a silicon nitride film, a silicon oxynitride film, an aluminum oxynitride film, or a silicon nitride oxide film can be used. Note that the materials which can be used for the protective film 119 are not limited to them, and any film which can suppress diffusion of copper element in the copper film used as the second metal films 110b and 112b can be used.

Next, part of the protective film 119 is selectively removed, whereby the sidewall protective films 120 and 122 are formed on the sidewalls of the source electrode 110 and the drain electrode 112, respectively. Note that at this stage, the transistor 160 is formed (see FIG. 5C).

The sidewall protective films 120 and 122 can be formed as follows, for example: the protective film 119 is subjected to overall anisotropic etching, whereby the protective film 119 in a portion other than the sidewalls of the source electrode 110 and the drain electrode 112 is removed. By such a formation method, since the sidewall protective films 120 and 122 can be formed in a self-aligned manner, the number of patterning steps can be reduced.

Note that when the sidewall protective films 120 and 122 are formed, part of the protective film 119 may remain on the source electrode 110 and the drain electrode 112.

Figure 5C:
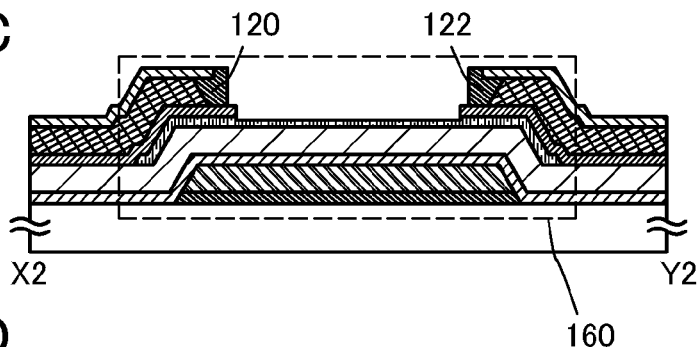
Figure 5D:
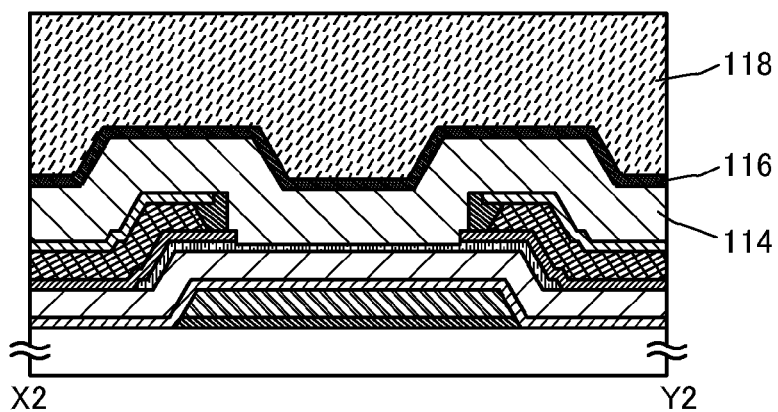

Then, the oxide insulating film 114, the protective insulating film 116, and the planarization insulating film 118 are formed over the oxide semiconductor film 108, the source electrode 110, the drain electrode 112, and the sidewall protective films 120 and 122 (see FIG. 5D).

The oxide insulating film 114, the protective insulating film 116, and the planarization insulating film 118 can be formed with reference to the above-described method for manufacturing the transistor 150.

[Structural Example 3 of Semiconductor Device]

Figure 6A:
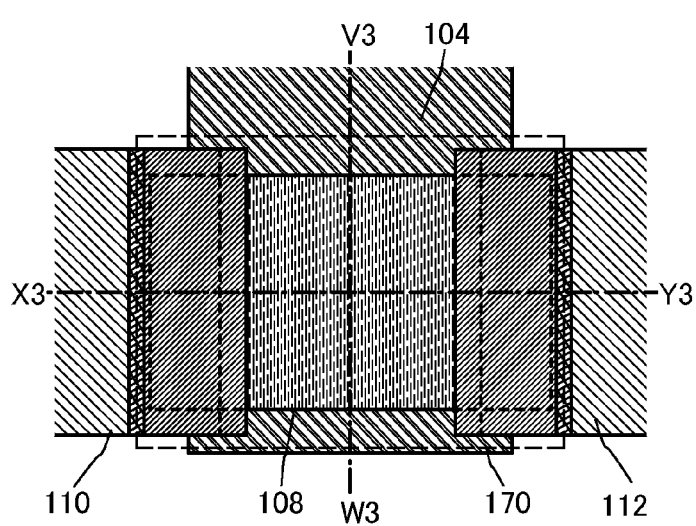
FIGS. 6A to 6C are a plan view illustrating a structural example 3 of a semiconductor device, a cross-sectional view taken along line X3-Y3 in FIG. 6A, and a cross-sectional view taken along line V3-W3 in FIG. 4C, respectively.
Figure 6C:
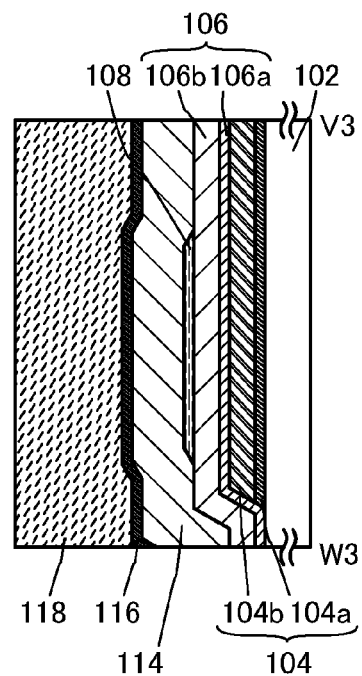
Figure 6B:
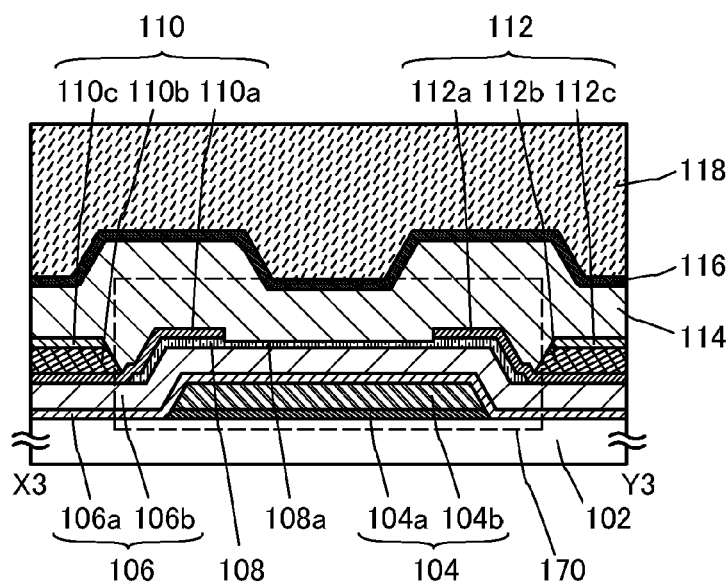

FIGS. 6A to 6C illustrate a structural example of a semiconductor device including a transistor 170. FIG. 6A is a plan view of the semiconductor device. FIG. 6B is a cross-sectional view taken along line X3-Y3 in FIG. 6B. FIG. 6C is a cross-sectional view taken along line V3-W3 in FIG. 6A. Note that in FIG. 6A, some components of the transistor 170 (e.g., a gate insulating film 106) are not illustrated for clarity.

The structural example 3 of a semiconductor device in FIGS. 6A to 6C is the same as the structural example 1 of a semiconductor device in FIGS. 1A to 1C except that the end portions of the second metal films 110b and 112b and the third metal films 110c and 112c on the channel formation region 108a side do not overlap with the oxide semiconductor film 108.

The structural example 3 of a semiconductor device can produce an effect similar to that of the structural example 1 of a semiconductor device. In addition, since the end portions of the second metal films 110b and 112b are apart from the channel formation region 108a, diffusion of copper element to the channel formation region 108a can be suppressed.

[Method 3 for Manufacturing Semiconductor Device]

The method 3 for manufacturing a semiconductor device is the same as the method 1 for manufacturing a semiconductor device except for the step illustrated in FIG. 3A.

In the method 3 for manufacturing a semiconductor device, in the step illustrated in FIG. 3A, wet etching time is adjusted when part of each of the third metal film 109c and the second metal film 109b is removed by the first etching using the resist mask 111 as a mask to form the third metal films 110c and 112c and the second metal films 110b and 112b. Thus, the end portion of each of the third metal films 110c and 112c and the second metal films 110b and 112b in the channel formation region side is reduced to a position not overlapping with the oxide semiconductor film 108.

Note that the structural example 3 of a semiconductor device may be modified in such a manner that the sidewall protective films 120 and 122 in the structural example 2 of the semiconductor device are formed on the end portions of the third metal films 110c and 112c on the channel formation region side and the second metal films 110b and 112b, by the steps illustrated in FIGS. 5B and 5C. As a result, an effect similar to that of the structural example 2 of a semiconductor device can be obtained.

This application is based on Japanese Patent Application serial No. 2012-158495 filed with Japan Patent Office on Jul. 17, 2012, the entire contents of which are hereby incorporated by reference.

What is claimed is:

1. A semiconductor device comprising:
   a gate electrode;
   a gate insulating film over the gate electrode;
   an oxide semiconductor film in contact with the gate insulating film, the oxide semiconductor film including a channel formation region overlapping with the gate electrode; and
   a source electrode and a drain electrode over the oxide semiconductor film; and
   an insulating layer over the source electrode and the drain electrode,
   wherein the source electrode and the drain electrode each include a first metal film, a second metal film over the first metal film and containing copper, and a third metal film over the second metal film, and
   wherein an end portion of the second metal film is offset from end portions of the first metal film and the third metal film from a center of the channel formation region.

2. The semiconductor device according to claim 1, wherein a thickness of the oxide semiconductor film in the channel formation region is smaller than a thickness of the oxide semiconductor film in a region in contact with the first metal film.

3. The semiconductor device according to claim 1, wherein the end portion of the second metal film on a channel formation region side is located in a position not overlapping with the oxide semiconductor film.

4. The semiconductor device according to claim 1, further comprising an oxide insulating film over the oxide semiconductor film, the source electrode, and the drain electrode.

5. The semiconductor device according to claim 1, further comprising a protective film covering the end portion of the second metal film on a channel formation region side.

6. The semiconductor device according to claim 1, wherein at least one of the first metal film and the third metal film comprises a metal or a metal nitride containing one or more elements selected from the group consisting of tungsten, tantalum, titanium, and molybdenum.

7. The semiconductor device according to claim 1, wherein the oxide semiconductor film is a film containing at least one oxide selected from the group consisting of indium oxide, zinc oxide, gallium oxide, and tin oxide.

8. The semiconductor device according to claim 1, wherein the oxide semiconductor film is an In—Ga—Zn-based oxide semiconductor film.

9. The semiconductor device according to claim 1,
   wherein the oxide semiconductor film includes a crystal part, and
   wherein the crystal part includes a c-axis which is aligned in a direction parallel to a normal vector of a surface where the oxide semiconductor film is located.

* * * * *